United States Patent
Um et al.

(10) Patent No.: US 12,333,169 B2
(45) Date of Patent: Jun. 17, 2025

(54) MEMORY SYSTEM FOR OPTIMIZING ON-DIE TERMINATION SETTINGS OF MULTI-RANKS, METHOD OF OPERATION OF MEMORY SYSTEM, AND MEMORY CONTROLLER

(71) Applicant: Samsung Electronics Co., Ltd., Suwon-si (KR)

(72) Inventors: Youngdo Um, Suwon-si (KR); Taeyoung Oh, Suwon-si (KR); Hoseok Seol, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/304,813

(22) Filed: Apr. 21, 2023

(65) Prior Publication Data

US 2023/0342050 A1  Oct. 26, 2023

(30) Foreign Application Priority Data

Apr. 25, 2022 (KR) .................. 10-2022-0051031
Jul. 22, 2022 (KR) .................. 10-2022-0091318

(51) Int. Cl.
   *G06F 3/06* (2006.01)
(52) U.S. Cl.
   CPC .......... *G06F 3/0634* (2013.01); *G06F 3/0611* (2013.01); *G06F 3/0673* (2013.01)
(58) Field of Classification Search
   CPC ..... G06F 3/0634; G06F 3/0673; G06F 3/0611
   See application file for complete search history.

(56) References Cited

U.S. PATENT DOCUMENTS

| | | |
|---|---|---|
| 8,169,233 B2 | 5/2012 | Ferolito et al. |
| 8,619,492 B2 | 12/2013 | Jeon |
| 10,141,935 B2 | 11/2018 | Bains et al. |
| 10,199,084 B2 | 2/2019 | Nale |
| 10,916,279 B2 | 2/2021 | Son et al. |
| 11,120,860 B1 * | 9/2021 | Wieduwilt ............ G11C 11/406 |
| 2010/0027356 A1 | 2/2010 | Oh et al. |
| 2011/0241727 A1 | 10/2011 | Oh et al. |
| 2013/0242680 A1 | 9/2013 | Heo et al. |
| 2014/0192583 A1 * | 7/2014 | Rajan .................. G11C 7/10 365/63 |
| 2017/0337965 A1 * | 11/2017 | Ware .................. G11C 8/12 |
| 2019/0018614 A1 * | 1/2019 | Balko .................. G06F 3/064 |

(Continued)

*Primary Examiner* — Jane W Benner
(74) *Attorney, Agent, or Firm* — Myers Bigel, P.A.

(57) ABSTRACT

Provided is a memory system including a host system including a memory controller configured to control a read or write operation for a plurality of memory ranks, based on target or non-target information for the plurality of memory ranks, and a memory device including a storage configured to store on-die termination (ODT) information of the memory ranks. Here, the memory controller is further configured to determine a target rank to be read or written, and transmit information about the determined target rank, to the memory device, and the memory device is further configured to perform a comparison of the ODT information of the memory ranks stored in the storage with target or non-target information received from the memory controller, and change an ODT value of the target rank, based on target information received from the memory controller based on a result of the comparison.

19 Claims, 13 Drawing Sheets

(56) References Cited

U.S. PATENT DOCUMENTS

2019/0304517 A1* 10/2019 Moon .................. G11C 7/1084
2021/0233575 A1    7/2021 Son et al.
2022/0365708 A1* 11/2022 Zhang ................. G11C 7/1057

* cited by examiner

FIG. 8

| COMMAND | CS | CA0 | CA1 | CA2 | CA3 | CK_t edge |
|---|---|---|---|---|---|---|
| WRITE(BL24) TARGET(RANK0) | H | L | H | H | WS | R1 |
| | X | C5 | AP | BG0 | BG1 | F1 |
| | H | C4 | D.ODT(0) | BA0 | BA1 | R2 |
| | X | C0 | C1 | C2 | C3 | F2 |

FIG. 9

| COMMAND | CS | CA0 | CA1 | CA2 | CA3 | CK_t edge |
|---|---|---|---|---|---|---|
| WRITE(BL24) Non TARGET(RANK1) | H | L | H | H | WS | R1 |
| | X | C5 | AP | BG0 | BG1 | F1 |
| | H | C4 | D.ODT(0) | BA0 | BA1 | R2 |
| | X | C0 | C1 | C2 | C3 | F2 |

FIG. 10

| COMMAND | CS | CA0 | CA1 | CA2 | CA3 | CK_t edge |
|---|---|---|---|---|---|---|
| READ(BL24) TARGET(RANK0) | H | L | L | H | WS | R1 |
| | X | C5 | AP | BG0 | BG1 | F1 |
| | H | C4 | D.ODT(0) | BA0 | BA1 | R2 |
| | X | C0 | C1 | C2 | C3 | F2 |

FIG. 11

| COMMAND | CS | CA0 | CA1 | CA2 | CA3 | CK_t edge |
|---|---|---|---|---|---|---|
| READ(BL24) Non TARGET(RANK1) | H | L | L | H | WS | R1 |
| | X | C5 | AP | BG0 | BG1 | F1 |
| | H | C4 | D.ODT(0) | BA0 | BA1 | R2 |
| | X | C0 | C1 | C2 | C3 | F2 |

//  # MEMORY SYSTEM FOR OPTIMIZING ON-DIE TERMINATION SETTINGS OF MULTI-RANKS, METHOD OF OPERATION OF MEMORY SYSTEM, AND MEMORY CONTROLLER

CROSS-REFERENCE TO RELATED APPLICATIONS

This application is based on and claims priority under 35 U.S.C. § 119 to Korean Patent Application Nos. 10-2022-0051031, filed on Apr. 25, 2022 and 10-2022-0091318, filed on Jul. 22, 2022, in the Korean Intellectual Property Office, the disclosures of which are incorporated by reference herein in their entireties.

BACKGROUND

The inventive concept relates to a memory system for optimizing on-die termination (ODT) settings of multi-ranks, a method of operation of the memory system, and a memory controller, and more particularly, to a method of efficiently storing information about a memory rank, which allows identification of a target rank or a non-target rank, in an information storage unit in the memory rank, and performing memory access.

A mobile-oriented memory device, such as a low power double data rate (LPDDR) synchronous dynamic random access memory (SDRAM), is mainly used for mobile electronics, such as smartphones, tablet PCs, and ultra books. As the capacity of the mobile operating system (OS) increases to support the multitasking operations performed on mobile electronic devices, there is a need for mobile electronic devices with high-speed operating performance while having more low power consumption characteristics.

A high-speed memory system may include multiple LPDDR SDRAM chips (hereinafter, referred to as "LPDDR memory chips") and a memory controller. The memory controller may divide individual chips from a plurality of LPDDR memory chips into logical and/or physical groups from perspectives such as power control, address designation, and memory access. For example, a plurality of LPDDR memory chips may be included in one of a plurality of ranks, which may be divided into target ranks and non-target ranks. The target rank may include a memory chip that performs memory access according to memory recast, and the non-target rank may include a memory chip that does not perform memory access. In the multi-rank memory system, the target rank may be selected by the activation of a chip selection signal (CS) of that rank. Thereafter, an ODT operation may be required for the data line on which the read/write data is loaded for read or write operations for the target rank. For example, the tODToff parameter period is required for the data line on which write data of the first rank and read data of the second rank are loaded at the rank-to-rank operation. The tODToff parameter indicates delay time required to turn off the ODT circuit of the first rank, which receives write data from the memory controller. After the tODToff parameter period, the read data, which is output from the second rank, may be transmitted to the memory controller through the data line. The rank-to-rank operation may be set to perform the read operation for the first rank and then perform the write operation for the second rank. In this case, tODTon parameter period is required. The tODToff parameter indicates delay time required to turn on the ODT circuit of the second rank, which receives write data.

However, in the case of the memory chip for implementing the transition to the target rank by the chip selection signal (CS) and the ODT operation, the hardware configuration became complicated, the power consumption increased, and the high-speed operation performance was not good due to the response delay to the ODT.

SUMMARY

The inventive concept provides a memory device capable of efficiently storing information about a memory rank, which allows identification of a target rank or a non-target rank, in an information storage unit in the memory rank, and performing memory access, without a complicated hardware and timing delay.

According to some embodiments of the inventive concept, there is provided a memory system including a host system including a memory controller configured to control a read or write operation for a plurality of memory ranks, based on target or non-target information for the plurality of memory ranks, and a multi-rank memory device including a storage configured to store on-die termination (ODT) information of the memory ranks. Here, the memory controller is further configured to determine a target rank to be read or written, and transmit information about the determined target rank, to the multi-rank memory device, and the multi-rank memory device is further configured to perform a comparison of the ODT information of the memory ranks stored in the storage with target or non-target information received from the memory controller, and change an ODT value of the target rank, based on the target information received from the memory controller and based on a result of the comparison.

According to some embodiments of the inventive concept, there is provided a method of operating a memory system including a plurality of memory ranks configured to share a signal line. The method includes controlling, by a host system including a memory controller, a read or write operation for a plurality of memory ranks, based on target or non-target information for the plurality of memory ranks, and storing ODT information of the memory ranks in a storage of a multi-rank memory device. The controlling of the read or write operation for the plurality of memory ranks includes determining a target rank to be read or written, and transmitting information about the determined target rank, to the multi-rank memory device, and comparing the ODT information of the memory ranks stored in the storage with target or non-target information received from the memory controller, and changing an ODT value of the target rank, based on the target information received from the memory controller and based on a result of the comparing.

Some embodiments of the inventive concept includes a host system that includes a memory device, and a memory controller. The memory controller is configured to control a read or write operation for a memory device comprising a plurality of memory ranks which share a signal line. The memory controller is further configured to control the memory device to determine a target rank to be read or written, and transmit information about the determined target rank, to the memory device. The memory controller is further configured to compare on-die termination (ODT) information of the memory ranks stored in a storage of the memory device with target or non-target information received from the memory controller, and change an ODT value of the target rank, based on the target information and based on a result of the comparison.

BRIEF DESCRIPTION OF THE DRAWINGS

Embodiments will be more clearly understood from the following detailed description taken in conjunction with the accompanying drawings in which:

FIGS. 8 and 9 illustrate a case where a write operation is performed in a target rank in a memory system according to some embodiments;

FIGS. 10 and 11 illustrate a case where a read operation is performed in a target rank in a memory system according to some embodiments;

DETAILED DESCRIPTION

Figure 1:
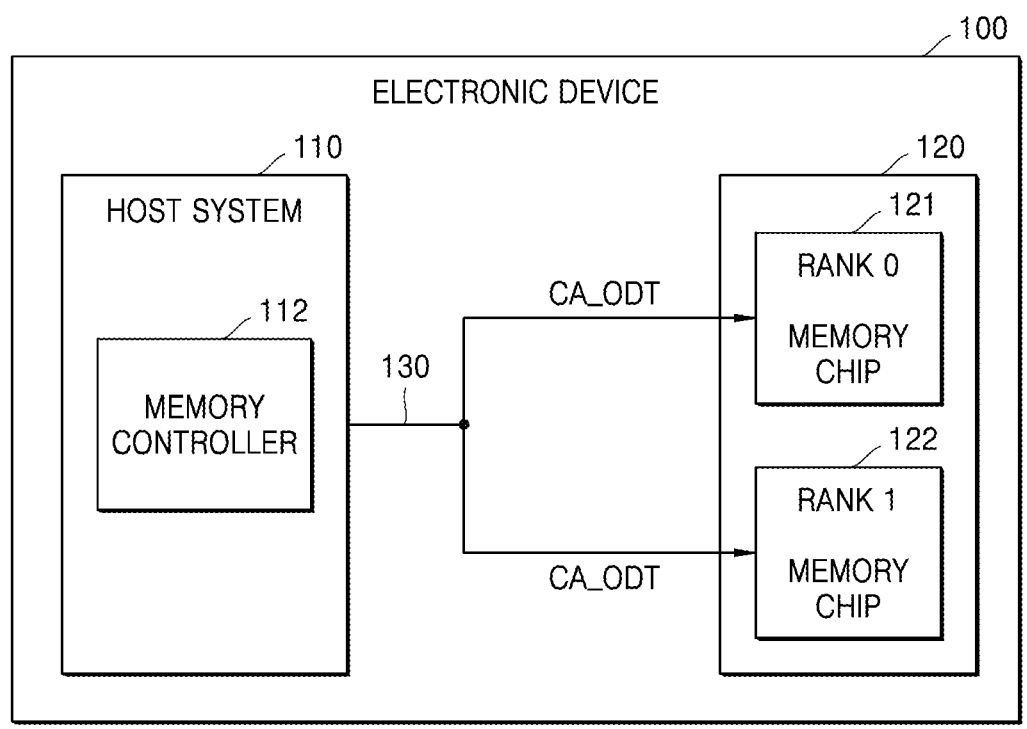
FIG. 1 is a block diagram illustrating an electronic device according to some embodiments.

FIG. 1 is a block diagram illustrating an electronic device according to some embodiments.

Referring to FIG. 1, an electronic device 100 may include a host system 110 and a multi-rank memory device 120. The electronic device 100 may be included in a personal computer (PC) or a mobile electronic device. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of things (IoT) device, an Internet of everything (IoE) device, or a drone.

The host system 110 is a primary component of the electronic device 100 that processes and manages commands, and is mainly in charge of the execution of operating systems and applications. In addition, the host system 110 may allow work load to be distributed to multiple computing entities so that the work load may be processed in parallel to solve complex tasks. The host system 110 is a functional block configured to execute commands executable by one or more machines or software, firmware, or pieces of their combinations. The host system 110 may be implemented using hardware for performing calculations and other operations (e.g., control operation, configuration operation, etc.) in the electronic device 100, that is, various circuit elements and devices.

The host system 110 may be implemented as an integrated circuit (IC), a system on chip (SoC), an application processor (AP), a mobile AP, a chipset, or a set of chips. As an example, the host system 110 may be a semiconductor device for performing a memory control function and may include a memory controller 112. The host system 110 may further include RAM, a central processing unit (CPU), a graphics processing unit (GPU), and/or a modem.

The multi-rank memory device 120 is composed of a function block that performs the operation of a memory (e.g., a main memory) for the electronic device 100, and may be implemented as an LPDDR SDRAM. The LPDDR SDRAM may include a memory circuit, and may process access to data and commands stored in a memory circuit, and perform other control or configuration operations. LPDDR SDRAM is a "dynamic" memory circuit. The dynamic memory circuit stores information (e.g., information bits such as data and commands) using circuit elements such as capacitors that lose charge over time due to leakage and/or other charge loss mechanisms. The DRAM cell, which consists of one transistor and one storage capacitor, shows variable data retention characteristics, and prevents the loss of stored information by storing DRAM cell data again by periodically performing a refresh operation.

The multi-rank memory device 120 may include a plurality of memory chips 121 and 122. For example, each of the plurality of memory chips 121 and 122 includes a memory cell array, and the memory cell array includes a plurality of bank groups including a plurality of banks, and each bank may include a plurality of memory cell rows (or pages).

The plurality of memory chips 121 and 122 may include LPDDR SDRAM and may logically and/or physically be divided into at least two ranks. In some embodiments, it is illustrated that the multi-rank memory device 120 has a 2-rank structure, but embodiments are limited thereto, and the multi-rank memory device 120 may have various rank structures. In the following embodiments, the memory chip 121 may be referred to as a first rank 121, and the memory chip 122 may be referred to as a second rank 122 for convenience of description. In addition, the first and second ranks 121 and 122 and terms RANK0 and RANK1 may be used interchangeably.

The memory controller 112 of FIG. 1 is a functional block for managing and controlling the interaction between the host system 110 and the multi-rank memory device 120, and processing the interaction in another manner. For example, the memory controller 112 may perform memory access (that is, reading, writing, etc.) on behalf of the host system 110, and perform configuration and control operation for the multi-rank memory device 120, and/or other operations. The memory controller 112 may communicate with the multi-rank memory device 120 through the channel 130. The channel 130 may be implemented as a bus that includes clock signal lines, which transmit clock signals CK_t and CK_c (hereinafter, referred to as "CK"), data clock signals WCK_t and WCK_c (hereinafter, referred to as "WCK"), and read data strobe signals RDQS_t and RDQS_c (hereinafter, referred to as "RDQS"), CA signal lines, which transmit command/address CMD/ADDR (hereinafter, referred to as "CA"), and DQ lines, which transmit data (hereinafter, referred to as "DQ").

Here, the host system 110 may transmit a command CA_ODT containing ODT information according to the read operation or write operation, to the multi-rank memory device 120 through the memory controller 112. The command CA_ODT, which contains ODT information, may contain ODT information that determines the target rank, and the case, in which a read or write operation for the target rank is performed, will be described in detail with reference to FIGS. 4 and 5.

Figure 2:
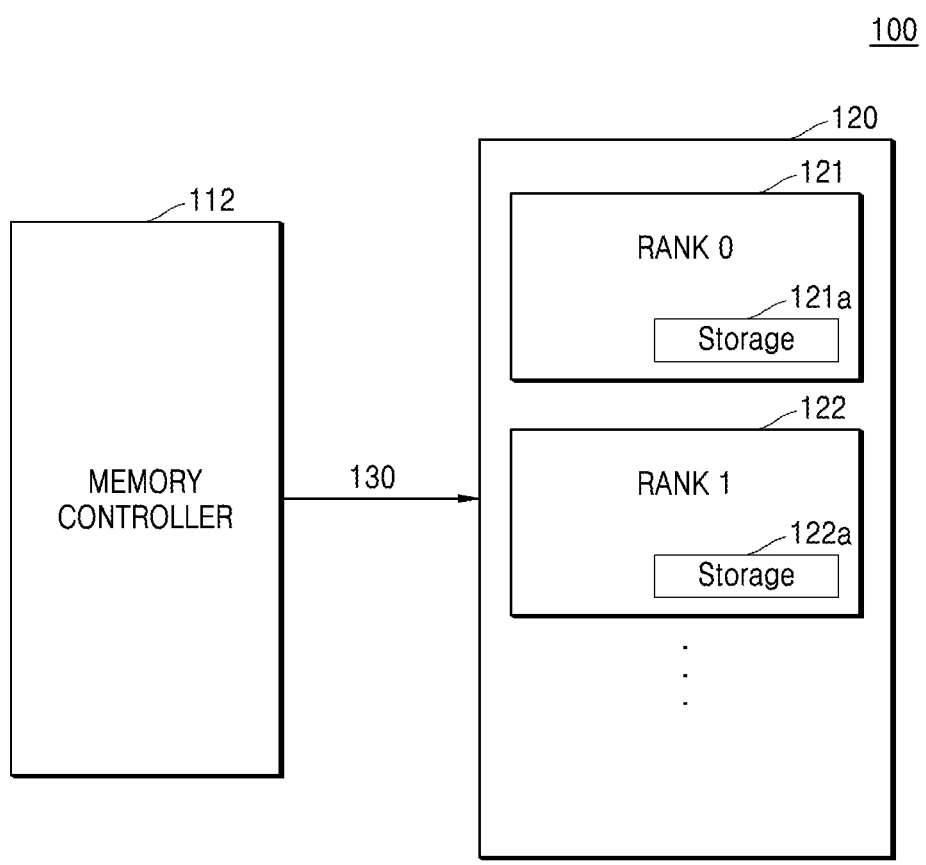
FIGS. 2 and 3 are block diagrams illustrating a memory device of FIG. 1.
Figure 3:
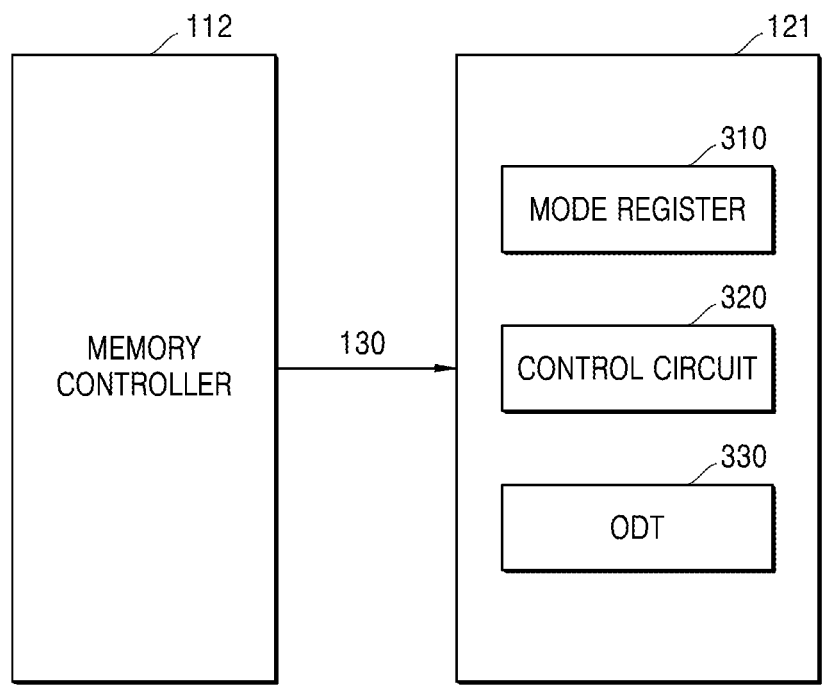

FIGS. 2 and 3 are block diagrams illustrating a multi-rank memory device 120 of FIG. 1.

Referring to FIG. 2, the multi-rank memory device 120 according to some embodiments includes a plurality of memory ranks 121, 122, . . . etc. Hereinafter, embodiments about a first rank 121 RANK0 and a second rank 122 RANK1 will be described for convenience of description, but embodiments may further include a case of including a plurality of memory ranks.

The memory ranks 121 and 122 according to some embodiments may include storages 121a and 122a, respectively. Information about the corresponding memory ranks RANK0 and RANK1 may be prestored in the storages 121a and 122a, respectively. Here, the storages 121a and 122a may include a nonvolatile memory device, but is not limited thereto.

Further, the memory ranks 121 and 122 of the multi-rank memory device 120 may be classified into the first rank 121 RANK0 and the second rank 122 RANK1 for convenience of description. Here, the first rank 121 RANK0 may be defined as a target memory rank to be read or written based on information received from the host system 110. Further, the second rank 122 RANK1 may be defined as a non-target rank which is not to be read or written. The same is applied to the description of the first rank and the second rank to be described below.

The memory controller 112 may control the read or write operation of the first rank 121 and the second rank 122 described above. For example, the memory controller 112 of the host system 110 may transmit commands including read or write command to the plurality of memory ranks 121 and 122 through the CA line. The commands transmitted by the memory controller 112 may contain information that specifies the target rank.

In addition, the memory controller 112 may classify the first rank 121 and the second rank 122 into a target rank and a non-target rank. The memory controller 112 may distinguish target ranks from non-target ranks by using commands transmitted through CA signal lines. For example, the memory controller 112 may include information of the target rank in the read or write command transmitted through the CA signal line of the channel 130. The memory controller 112 may read the rank information stored in the storages 121a and 122a of the first and second ranks 121 and 122. The memory controller 112 may receive the rank information stored in the storages 121a and 122a through the CA signal lines of the channel 130. The memory controller 112 may compare rank information read from the first and second ranks 121 and 122 with rank information for the first and second ranks 121 and 122 stored as defaults in the memory controller 112. As a result of the comparison, if the rank information read from the first and second ranks 121 and 122 is not identical to the rank information for the first and second ranks 121 and 122 stored as defaults in the memory controller 112, the memory controller 112 may change the rank information for the first and second ranks 121 and 122 into the read rank information and store the read rank information.

For example, the storage 121a of the first rank 121 may set rank information thereof to a single "0" bit value. The storage 122a of the second rank 122 may set rank information thereof to a single "1" bit value. According to some embodiments, if the multi-rank memory device 120 includes more ranks than the two-rank structure, the rank information may store the rank information using two or more bits.

In order to accurately perform the memory operation for the target rank, the memory controller 112 may use the rank information of each of the first and second ranks 121 and 122 as the ODT information of the corresponding rank.

In addition, the memory controller 112 may perform a refresh operation for the memory ranks 121 and 122. For example, the memory controller 112 may perform a refresh operation of restoring the target rank after performing the read or write operation for the target rank.

Referring to FIG. 3, the first rank 121 may be connected to the memory controller 112 through a clock signal line 302, CA signal lines 304, and a data bus 306 of the channel 130.

The clock signal CK generated by the memory controller 112 may be provided as the first rank 121 through the clock signal line 302. For example, the clock signal CK may be provided as a continuous alternative inverted signal together with an inverted clock signal (CKB). The clock signal pairs (CK, CKB) may improve timing accuracy because rising/falling edges may be detected from the intersection thereof. The clock signal line 302 may transmit complementary continuous alternative inverted signals using a clock signal pair (CK, CKB). In this case, the clock signal line 302 may be composed of two signal lines for transmitting the clock signals CK and CKB. The clock signal CK described in embodiments may be described as a clock signal pair (CK, CKB). For convenience of description, the clock signal pair (CK, CKB) is collectively named a clock signal CK.

The command signal transmitted from the memory controller 112 may be provided to the first rank 121 through the CA signal lines 304. In addition, the address signal issued by the memory controller 112 may be provided to the first rank 121 through the CA signal lines 304. The command or address signal may be issued by the combination of command/address signals received in a temporal sequence through the CA signal lines 304.

Data DQ may be transmitted through the data bus 306 for the data interface between the memory controller 112 and the first rank 121. For example, write data DQ provided by the memory controller 112 may be transmitted to the first rank 121 through the data bus 306. Read data DQ read in the first rank 121 may be transmitted to the memory controller 112 through the data bus 306.

The first rank 121 may include a mode register 310 and a control circuit 320. The control circuit 320 may generally control operations of the first rank 121. The control circuit 320 may generate control signals to perform write operation, read operation and/or refresh operation.

The mode register 310 may program the functions, characteristics and/or modes of the first rank 121. The mode register 310 may be programmed by a mode register setting (MRS) command and may be programmed as user defined variables. The mode register 310 may be divided into various fields, depending on the functions, characteristics and/or modes. Since not all the registers in the mode register 310 have the default values defined, the contents of the mode register 310 may be initialized. That is, the contents of the mode register 310 may be programmed after a reset for power-up and/or correct operation. In addition, the contents of the mode register 310 may be changed due to the re-execution of the mode register setting (MRS) command during the normal operation. Accordingly, the functions, characteristics and/or modes of the first rank 121 may be updated.

For example, the mode register 310 may store data for controlling the burst length (BL), a read burst type (RBT), a column address strobe (CAS) latency (CL), a test mode, a delay-locked loop (DLL) reset, DLL enable/disable, output drive intensity, additive latency (AL), output buffer enable/disable, CAS write latency, power down mode, a data mask function, a write data bus inversion (DBI) function, a read DBI function, etc.

In addition, the mode register 310 may store information for controlling the ODT function of each of the first and second ranks 121 and 122. The information for controlling the ODT function may include SoC ODT function, CK ODT function, CS ODT function, CA ODT function, and/or DQ ODT function. The SoC ODT function may be provided to improve the signal integrity (SI) by adjusting the swing width and/or driver strength of the signals transmitted between the memory controller 112 and the first rank 121. The CK ODT function is to perform ODT enable or disable operation of a clock signal receiver. In the CS ODT function, when the memory device 120 is implemented in a multi-rank configuration, the ODT enable or disable operation of the chip select (CS) signal receiver may be performed in order to ensure operations which are appropriate for the multi-rank configuration. The CA ODT function is to perform an ODT enable or disable operation of a receiver connected to the CA signal line. The DQ ODT function is to perform ODT enable or disable operation of a receiver connected to a data bus. In addition, the CA ODT function and DQ ODT function may be provided to set the ODT value of the CA signal line receiver and the DQ bus receiver.

Figure 4:
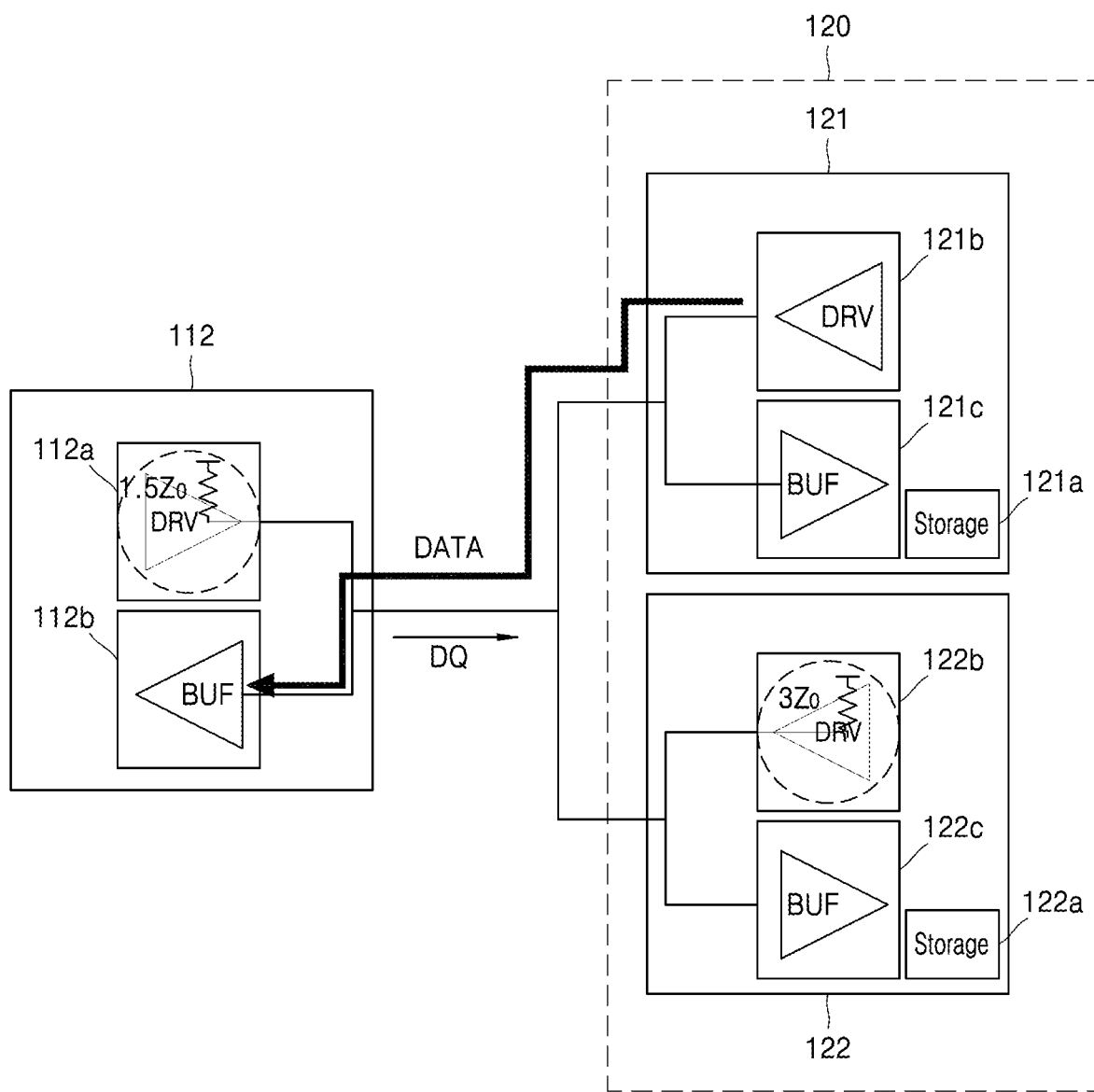
FIG. 4 is a block diagram illustrating a case where a target rank performs a read operation in a memory system according to some embodiments.
Figure 5:
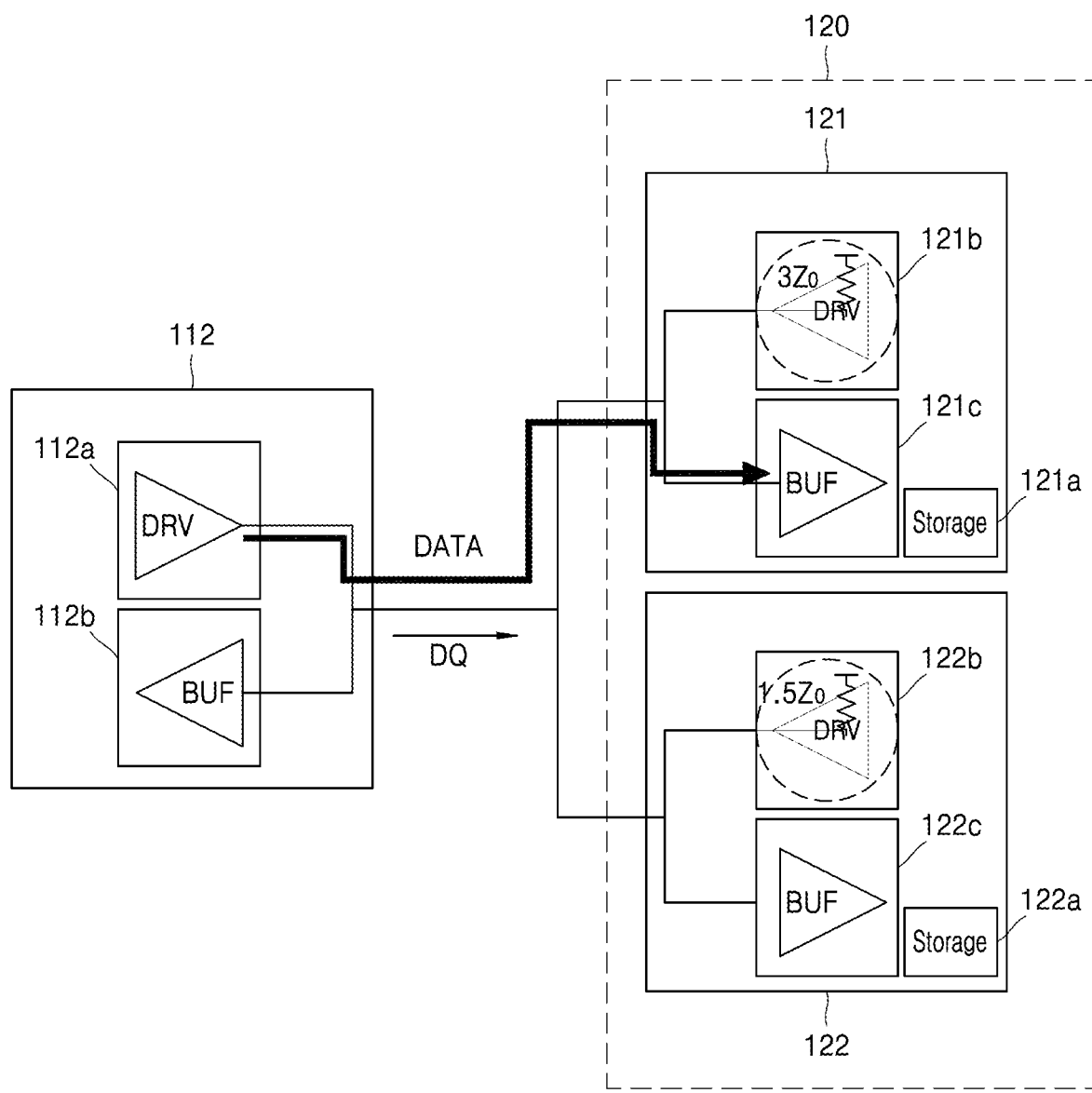
FIG. 5 is a block diagram illustrating a case where a write operation is performed in the target rank in a memory system according to some embodiments.

FIG. 4 is a block diagram illustrating a case where a target rank performs a read operation in a memory system according to some embodiments, and FIG. 5 is a block diagram illustrating a case where a write operation is performed in the target rank in a memory system according to some embodiments.

Referring to FIGS. 4 and 5, the memory controller 112 according to some embodiments includes a driver 112a and a buffer 112b. In addition, the memory ranks 121 and 122 include storages 121a and 122a which store bank information thereof, drivers 121b and 122b which transmit data stored in the memory ranks 121 and 122 to the memory controller 112 through a DQ bus, and buffers 121c and 122c which receive data from the memory controller 112 through the DQ bus, respectively. Here, it is assumed that the first rank 121 is a target rank, and the second rank 122 is a non-target rank.

Referring to FIG. 4, when data stored in the multi-rank memory device 120 is read according to some embodiments, the impedance value of the driver 112a of the memory controller 112 and the impedance value of the driver 122b of the second rank 122 may be set differently. For example, the impedance value of the driver 112a of the memory controller 112 is set to 1.5 Zo, and the impedance value of the driver 122b of the second rank 122 may be set to 3 Zo. Here, the impedance value of the first rank 121 may be a target read ODT value, and the impedance value of the second rank 122 may be a non-target read ODT value.

That is, when the data stored in the multi-rank memory device 120 is read according to some embodiments, the target rank may have a target read ODT value, and the memory device 120 may perform a read operation for the target rank. However, the non-target rank has a non-target read ODT value, and the multi-rank memory device 120 does not perform a read operation for the non-target rank. In addition, the impedance value of the driver 112a of the controller 112 and/or the impedance value of the driver 122b of the second rank 122 may be stored in the mode register 310 of the second rank 122 (FIG. 3).

Read data output from the driver 122b of the first rank 121 may be received in the buffer 112b of the memory controller 112, based on the impedance value of the driver 122a of the memory controller 112 and the impedance value of the driver 122b of the second rank 122.

For example, in order to read the data stored in the first rank 121, the memory controller 112 may transmit a command, which contains information about the first rank 121, to the multi-rank memory device 120 through CA signal lines of the channel 130. Read commands containing information about the first rank 121 will described in detail with reference to FIGS. 10 and 11.

Referring to FIG. 5, when data is written to the multi-rank memory device 120 according to some embodiments, the impedance value of the driver 121b of the first rank 121 and the impedance value of the driver 122b of the second rank 122 may be set differently. For example, the impedance value of the driver 121b of the first rank is set to 3 Zo, and the impedance value of the driver 122b of the second rank 122 may be set to 1.5 Zo. The impedance value of the driver 121b of the first rank 121 may be set in the storage of the first rank 121, and the impedance value of the driver 122b of the second rank 122 may be set in the storage 122a of the second rank 122. Here, the impedance value of the first rank 121 may be a target write ODT value, and the impedance value of the second rank 122 may be a non-target write ODT value.

That is, when data stored in the multi-rank memory device 120 according to some embodiments is written, the target rank may have a target write ODT value, and the multi-rank memory device 120 may perform a write operation for the target rank. However, the non-target rank has a non-target write ODT value, and the multi-rank memory device 120 does not perform a write operation for the non-target rank.

Write and read commands containing information about the first rank 121 will described in detail with reference to FIGS. 8 and 9.

However, the ODT value is just an example, an ODT value having a separate impedance value may be configured as long as the target rank may be distinguished from the non-target rank.

Figure 6:
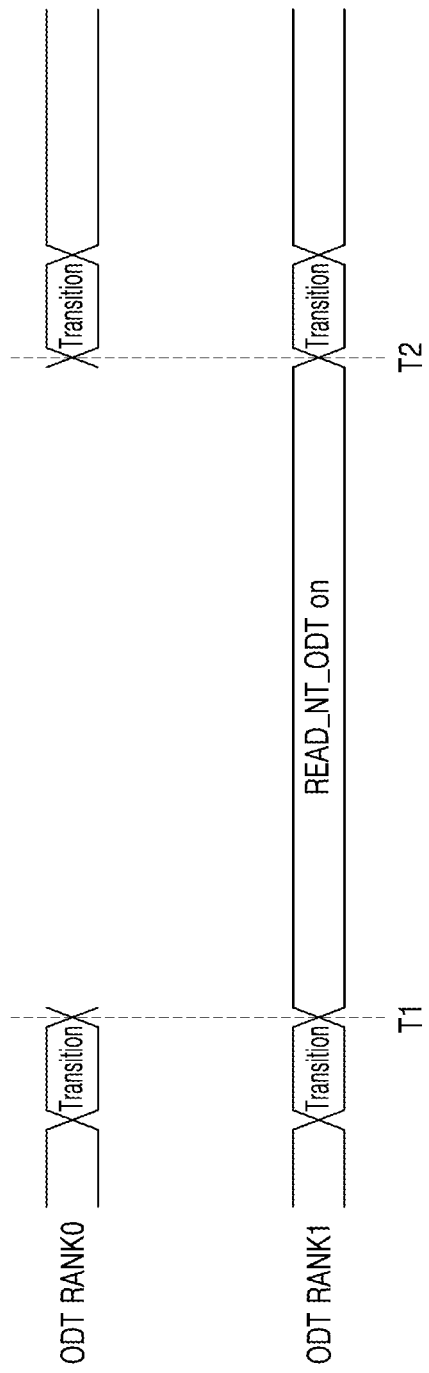
FIG. 6 is a timing diagram illustrating a case where a read operation is performed in a memory system according to some embodiments.
Figure 7:
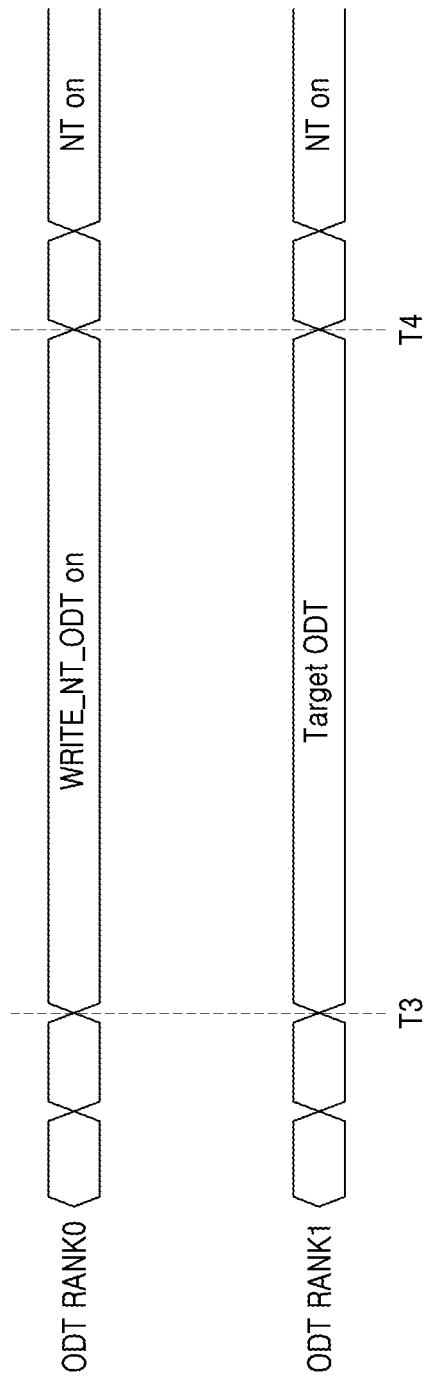
FIG. 7 is a timing diagram illustrating a case where a write operation is performed in a memory system according to some embodiments.

FIG. 6 is a timing diagram illustrating a case where a read operation is performed in a memory system according to some embodiments, and FIG. 7 is a timing diagram illustrating a case where a write operation is performed in a memory system according to some embodiments. In FIGS. 6 and 7, "ODT RANK0" means ODT information of the first rank 121, and "ODT RANK1" means ODT information of the second rank 122. That is, "ODT RANK0" may mean ODT information of a target rank, and "ODT RANK1" may mean ODT information of a non-target rank.

Referring to FIG. 6, when a read operation for the first rank 121 of the memory system according to some embodiments is performed in a period between time point T1 to time point T2, the data bus ODT of the first rank 121, which is the target rank, may be at an off state, and the second rank 122, which is a non-target rank, may be at an ODT on state. In order to perform the data read operation for the target rank before time point T1, a command including rank information of the first rank 121 would have been transmitted to the memory ranks 121 and 122 through CA signal lines.

Referring to FIG. 7, when a write operation for the second rank 122 of the memory system according to some embodiments is performed in a period between time point T3 and time point T4, the ODT of the first rank 121, which is the target rank, may be at an on state, and the second rank 122, which is a non-target rank, may be at an ODT on state. In order to perform the data write operation for the target rank before time point T3, a command including rank information of the first rank 121 would have been transmitted to the memory ranks 121 and 122 through CA signal lines.

FIGS. 8 and 9 are diagrams illustrating a write command for distinguishing target ranks from non-target ranks in a memory system 10 according to some embodiments. FIGS. 8 and 9 show a case where the burst length BL, which indicates the number of column locations accessible to the write command, is 24. In FIGS. 8 and 9, "RANK0" means the first rank 121, and "RANK1" means the second rank 122. That is, "RANK0" may mean a target rank, and "RANK1" may mean a non-target rank.

Referring to FIGS. 8 and 9, operands of the write command are provided in a chip selection signal (CS) and command addresses CA [0] to CA [3]. Here, the information included in the chip selection signal (CS) and the command addresses CA [0] to CA [3] may be provided at the time of a rise or fall of clock edge CK_t edge.

For example, in the case of the write command, operands may be provided in the chip selection signal CS: H and command addresses CA [0] to CA [3] at the first clock rise edge R1. In addition, the first clock rising edge R1 may include a command synchronization signal WS for transmitting data. Additional operands may be input at the first clock CK falling edge F1, the second clock CK rising edge R2, and the second clock CK falling edge F2. Operands (variables, fields, or values that indicate specific aspects of write commands) may include WS, AP, BG0 to BG1, BA0 to BA1, C0 to C5, and D.ODT provided by LPDDR specification. BG0 to BG1 may indicate bank group addresses, BA0 to BA1 may indicate bank addresses, and C0 to C5 may indicate column addresses.

Here, the second rising clock edge R2 may include information about the first rank 121 in which the read operation is performed. Information about the first rank 121 may be used as the ODT information of the first rank 121. Information about the first rank 121 may be referred to as dynamic ODT signal D.ODT. For convenience of description, information about the first rank 121 and the dynamic ODT signal D.ODT may be used interchangeably. For example, in FIG. 6, when the dynamic ODT signal D.ODT is applied as "0", the first rank 121 may perform the write operation according to the write command to the target rank. At this time, in the storage 121a of the first rank 121, the dynamic ODT signal D.ODT may be set to "0".

In FIG. 9, if the dynamic ODT signal D.ODT is applied as "0", the second rank 122 may operate as a non-target rank for the write command. At this time, in the storage 122a of the second rank 121, the dynamic ODT signal D.ODT may be set to "1".

FIGS. 10 and 11 illustrate a case where a read operation is performed in a target rank in a memory system 10 according to some embodiments. In FIGS. 10 and 11, "RANK0" means the first rank 121, and "RANK1" means the second rank 122. That is, "RANK0" may mean a target rank, and "RANK1" may mean a non-target rank.

Referring to FIGS. 10 and 11, operands of the read command are provided in a chip selection signal (CS) and command addresses CA [0] to CA [3]. Here, the information included in the chip selection signal (CS) and the command addresses CA [0] to CA [3] may be provided at the time of a rise or fall of clock edge CK_t edge.

For example, in the case of the read command READ CMD, operands may be provided in the chip selection signal (CS: H) and command addresses CA [0] to CA [3] at the first clock rise edge R1. In addition, the first clock rising edge R1 may include a command synchronization signal WS for transmitting data. Additional operands may be input at the first clock CK falling edge F1, the second clock CK rising edge R2, and the second clock CK falling edge F2. Operands (variables, fields, or values that indicate specific aspects of read commands) may include WS, AP, BG0 to BG1, BA0 to BA1, C0 to C5, and D.ODT provided by LPDDR specification. BG0 to BG1 may indicate bank group addresses, BA0 to BA1 may indicate bank addresses, and C0 to C5 may indicate column addresses.

Here, the second rising clock edge R2 may include information about the first rank 121 in which the read operation is performed. For example, in FIG. 10, when the dynamic ODT signal D.ODT is applied to "0", the first rank 121 may operate the write operation according to the read command READ CMD to the target rank. At this time, in the storage 121a of the first rank 121, the dynamic ODT signal D.ODT may be set to "0".

In FIG. 11, if the dynamic ODT signal D.ODT is applied as "0", the second rank 122 may operate as a non-target rank for the read command READ CMD. At this time, in the storage 122a of the second rank 121, the dynamic ODT signal D.ODT may be set to "1".

Figure 12:
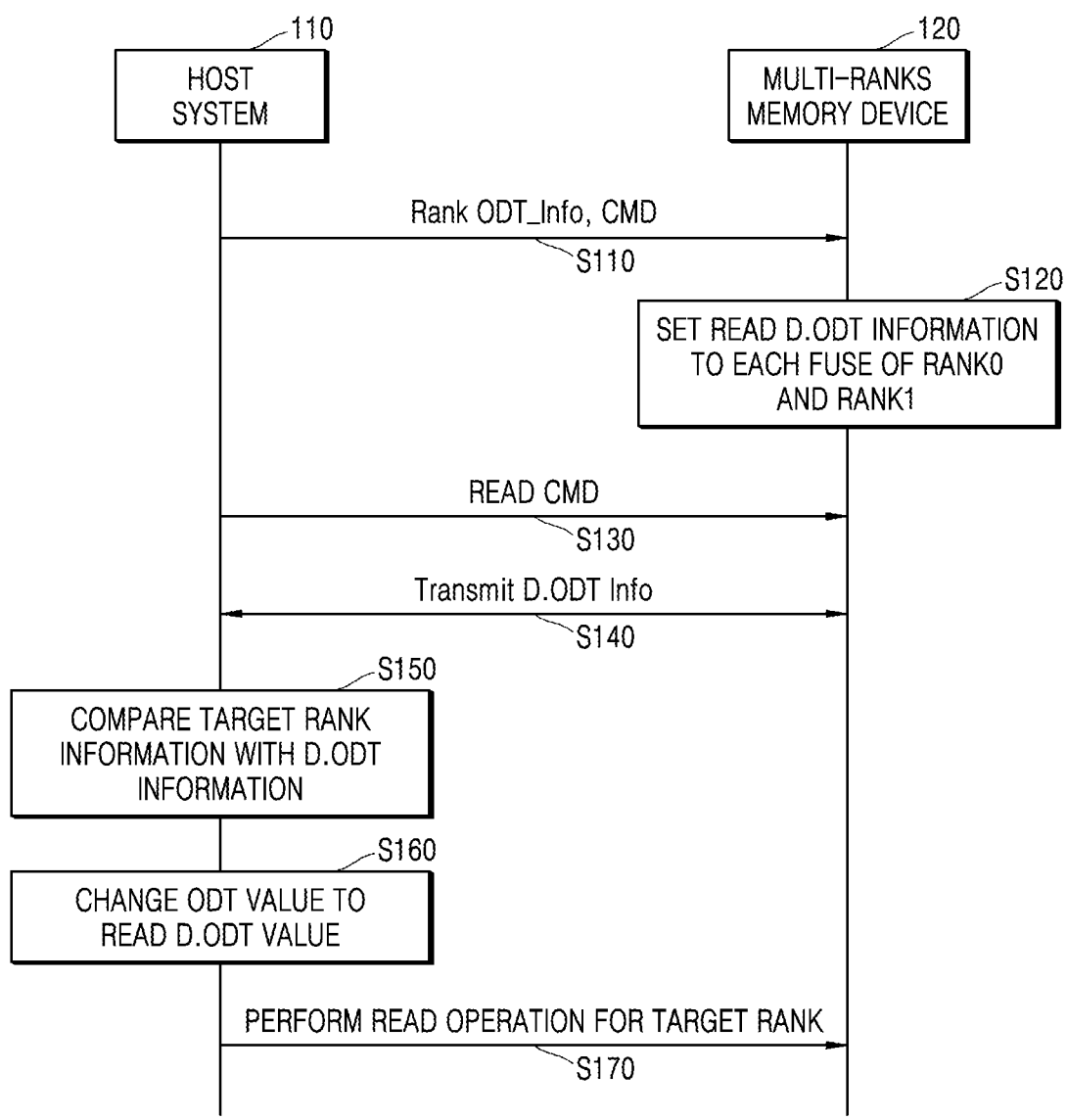
FIG. 12 is flowchart of an operating method of a memory system according to some embodiments.

FIG. 12 is flowchart of an operating method of the memory system 10, according to some embodiments.

Referring to FIG. 12, the host system 110 transmits a plurality of commands and ODT information (Rank ODT_Info) for memory ranks 121 and 122 to the multi-rank memory device 120 through the memory controller 112 (S110). Here, ODT information (Rank ODT_Info) for the memory ranks 121 and 122 may include ODT information for the target rank and the non-target rank.

In addition, the multi-rank memory device 120 may set read D.ODT information to the fuse of the target rank RANK0 121 and the non-target rank RANK1 122 (S120). Here, the fuse is just an example and may be replaced by another storage device. In addition, D.ODT information may be a unique impedance value set in the memory rank.

The host system 110 may transmit read command READ_CMD to the multi-rank memory device 120 in order to read data stored in the memory ranks 121 and 122 (S130). In addition, the multi-rank memory device 120 may transmit and receive D.ODT information of each memory rank to and from the host system 110 (S140).

Here, the memory controller 112 of the host system 110 may compare information of the target rank RANK0 121 with D.ODT information of memory ranks 121 and 122 (S150). For example, in order to determine the target rank RANK0 121, the memory controller 112 may determine a memory rank having a D.ODT that is identical to the read ODT value among a plurality of memory ranks, as the target rank RANK0 121. In addition, the memory controller 112 may transmit the information of the determined target rank RANK0 121 to the multi-rank memory device 120.

If the target rank RANK0 121 is determined, the memory controller 112 may change the ODT value to the D.ODT value of the target rank (S160). For example, the memory controller 112 may determine the memory rank having an ODT value that is identical to the read ODT value, as the target rank RANK0 121 and may set the ODT value as the D.ODT value of the target rank.

If the ODT value is changed, the multi-rank memory device 120 performs the read operation for the target rank RANK0 121 (S170).

Figure 13:
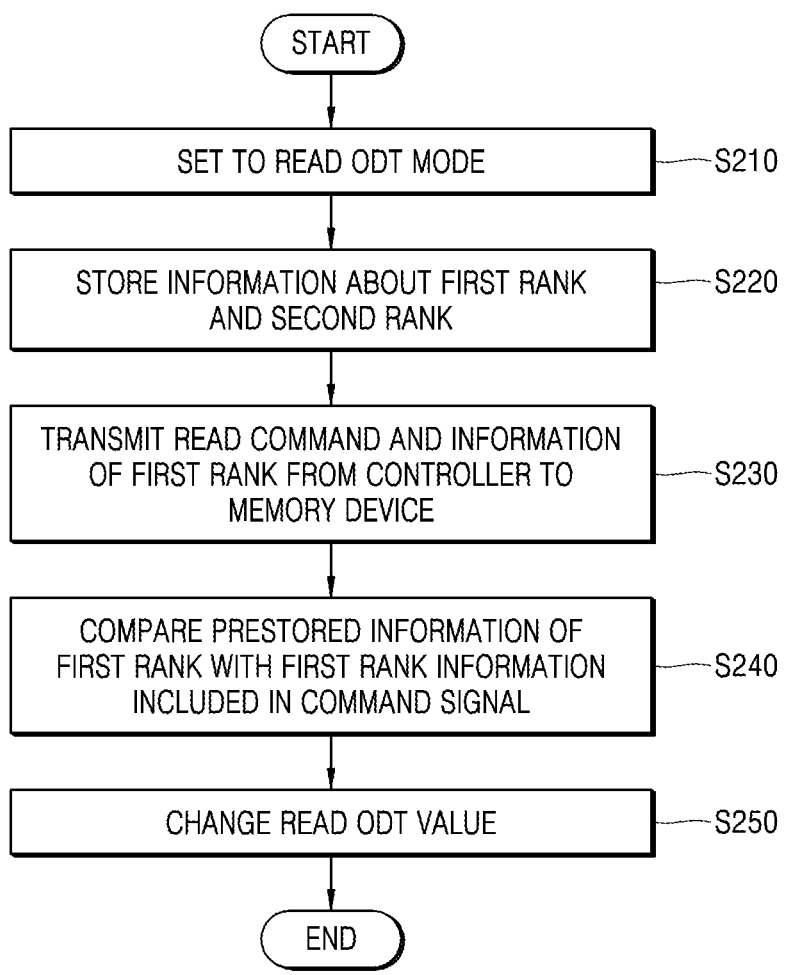
FIG. 13 is a flowchart of a read operation for a target rank in an operating method of a memory system, according to some embodiments.

FIG. 13 is a flowchart of a read operation for a target rank in an operating method of the memory system 10, according to some embodiments.

Referring to FIG. 13, the memory controller 112 may set the control mode to read ODT mode in order to perform the read operation for at least one memory device of the multi-rank memory device 120 (S210).

When the read operation of the multi-rank memory device 120 is performed, ODT information for the first and second ranks according to some embodiments may be stored in the memory controller 112 in advance (S220). Here, the first rank means the target rank, and the second rank means a non-target rank. For example, ODT information about each memory rank may be stored in advance in the storage of the multi-rank memory devices 121a and 122a, and the memory controller 112 may store ODT information about the stored memory ranks in advance. Here, the storages 121a and 122a may be a fuse or a nonvolatile memory device, but not limited thereto.

When ODT information for the first and second ranks is stored, the memory controller transmits the read command and ODT information of the first rank to the multi-rank memory device 120 (S230). Here, ODT information of the first rank may be read ODT information. In addition, the ODT information of the first rank may be included in the command address signal CA and transmitted to the multi-rank memory device 120. ODT information about the first rank may include D.ODT information.

When the read command and the ODT information of the first rank are transmitted to the multi-rank memory device 120, the memory controller 112 compares the information of the prestored first rank and the information of the first rank included in the read command signal (S240). The information compared here may be the D.ODT information included in the read command signal and D.ODT information of the memory ranks stored in the storages 121a and 122a of the memory ranks 121 and 122.

As a result of comparing prestored information of the first rank with information of the first rank included in the read command signal, the multi-rank memory device 120 determines a multi-rank identical to D.ODT information included in the read command, as the target rank, and changes the ODT setting value to a value identical to the D.ODT value of the target rank (S250). If the ODT setting value is changed, the read operation of only the target rank is performed, and the non-target rank fails to recognize the read command.

Figure 14:
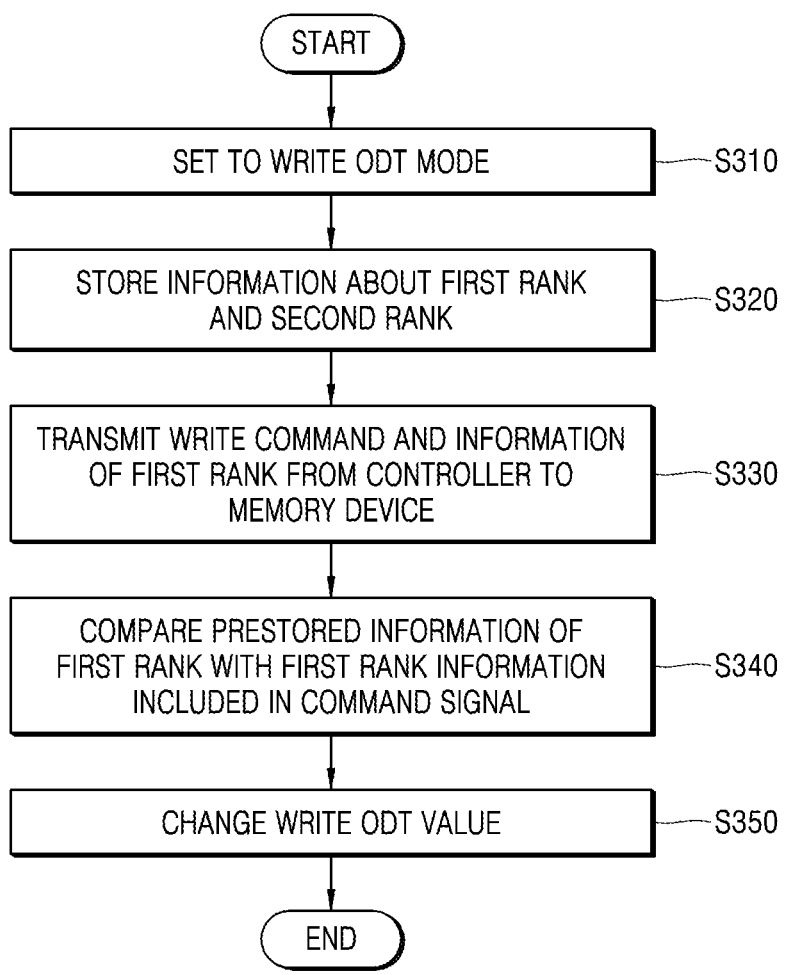
FIG. 14 is a flowchart of a write operation for a target rank in an operating method of a memory system, according to some embodiments.

FIG. 14 is a flowchart of a write operation for a target rank in an operating method of the memory system 10, according to some embodiments.

Referring to FIG. 14, the memory controller 112 may set the control mode to write ODT mode in order to perform the write operation for at least one memory device of the multi-rank memory device 120 (S310).

When the write operation of the multi-rank memory device 120 is performed, ODT information for the first and second ranks according to some embodiments may be stored in the memory controller 112 in advance (S320). Here, the storages 121a and 122a may be a fuse or a nonvolatile memory device, but not limited thereto. In addition, the first rank means the target rank, and the second rank means a non-target rank. For example, ODT information about each memory rank may be stored in advance in the storage of the multi-rank memory devices 121a and 122a, and the memory controller 112 may store ODT information about the stored memory ranks in advance.

When ODT information for the first and second ranks is stored, the memory controller transmits the write command and ODT information of the first rank to the multi-rank memory device 120 (S230). Here, ODT information of the first rank may be write ODT information. In the memory controller, the write command signal may contain ODT information of the first rank, the ODT information of the first rank may be included in the command address signal CA and transmitted to the multi-rank memory device 120. ODT information about the first rank may include D.ODT information.

When the write command and the ODT information of the first rank are transmitted to the multi-rank memory device 120, the memory controller 112 compares the information of the prestored first rank and the information of the first rank included in the write command signal (S240). The information compared here may be the D.ODT information included in the write command signal and D.ODT information of the memory ranks stored in the storages 121a and 122a of the memory ranks 121 and 122.

As a result of comparing prestored information of the first rank with information of the first rank included in the write command signal, the memory controller 112 determines a multi-rank identical to D.ODT information included in the read command, as the target rank, and changes the ODT setting value to a value identical to the D.ODT value of the target rank (S250). When the ODT setting value is changed, the ODT value of the target rank becomes different form the ODT value of the non-target rank, the write operation for only the target rank is performed, and the non-target rank fails to recognize the write command.

Figure 15:
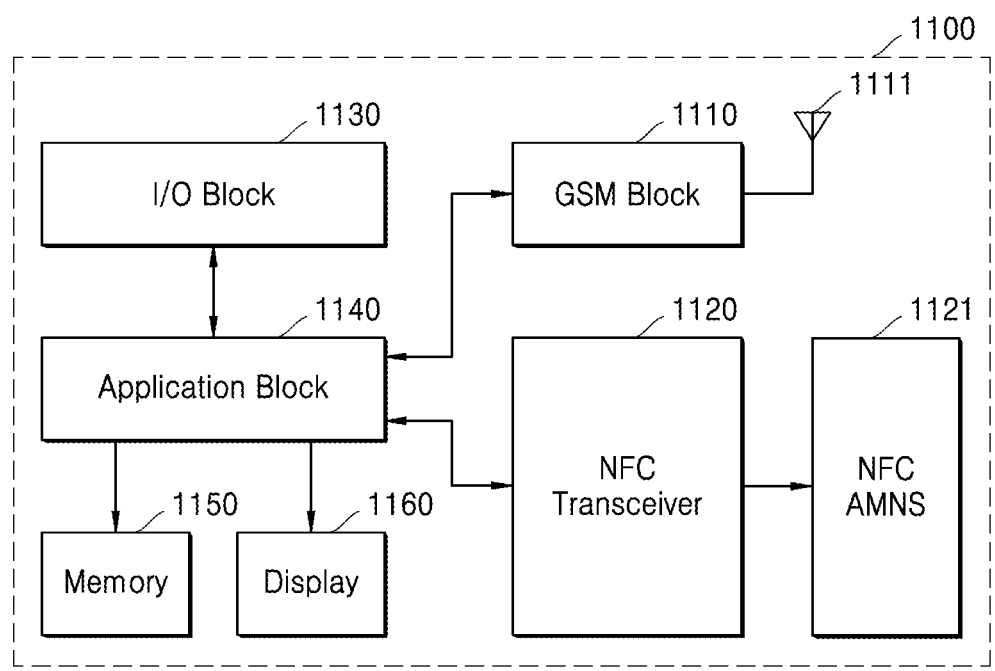
FIG. 15 is a block diagram of an example of applying a memory system to a mobile device, according to some embodiments.

FIG. 15 is a block diagram of an example of applying the memory system 10 to a mobile device, according to some embodiments.

Here, the mobile device may include a mobile phone, a smartphone, a computing tablet, a wireless enabled e-reader, and a wearable computing device.

Referring to FIG. 15, a mobile device 1100 includes a global system for mobile communication (GSM) block 1110, a near field communication (NFC) transceiver 1120, an input/output block 1130, an application block 1140, a memory 1150, and a display 1160. Components/blocks of the mobile device 1100 are exemplarily illustrated in FIG. 11. The mobile device 1100 may include more or less components/blocks. In addition, according to some embodiments, it is illustrated that GSM technology is used, but the mobile device 1100 may be implemented using other technologies such as code division multiple access (CDMA). Blocks of FIG. 11 may be implemented in the form of an integrated circuit. According to some embodiments, some of the blocks may be implemented in the form of an integrated circuit, and other blocks may be implemented in separate forms.

The GSM block 1110 may be connected to the antenna 1111, and may operate to provide a wireless phone operation in a known manner. The GSM block 1110 may internally include a receiver and a transmitter to thereby perform the corresponding receiving and transmitting operations.

The NFC transceiver 1120 may be configured to transmit and receive NFC signals using inductive coupling for wireless communication. Wireless communication may include a private area network such as Bluetooth, a short-range network such as WiFi, and/or a wide range of network such as WiMAX, or other wireless communication. The NFC transceiver 1120 may provide NFC signals to an NFC antenna matching network system 1121, and the NFC antenna matching network system 1121 may transmit NFC signals through inductive coupling. The NFC antenna matching network system 1121 may receive NFC signals provided from another NFC device and provide the received NFC signals to the NFC transceiver 1120.

The application block 1140 may include hardware circuits, for example, one or more host systems, and may operate to provide a variety of user applications provided by the mobile device 1100. User applications may include voice call operations, data transfer, and data swap. The application block 1140 may operate together with the GSM block 1110 and/or the NFC transceiver 1120 to provide the operation features of the GSM block 1110 and/or the NFC transceiver 1120. In some embodiments, the application block 1140 may include a program for the Point Of Sales (POS). These programs may provide credit card purchase and payment functions using a mobile phone, that is, a smartphone.

The display 1160 may display images in response to the display signals received from the application block 1140. Images may be provided by the application block 1140 or generated by a camera embedded in the mobile device 1100. The display 1160 internally includes a frame buffer for temporary storage of the pixel values, and may be composed of a liquid crystal display screen together with the related control circuits.

The input/output block 1130 provides the user with an input function and provides outputs to be received through the application block 1140. The input/output block 1130 shows the hardware devices and software components associated with interaction with the user. The input/output block 1130 may operate to manage some hardware of the display 1160 and/or an audio system. For example, an input through a microphone or an audio device may be provided as an application block 1140. When the display 1160 includes a touch screen, the display 1160 may function as an input device that may be partially managed by the input/output block 1130. In order to provide the input/output (I/O) function managed by the input/output block 1130, there may be additional buttons or switches in the mobile device 1100. The input/output block 1130 may manage devices such as an accelerator, a camera, an optical sensor, or other environmental sensors, a gyroscope, a global positioning system (GPS) or other hardware that may be included in the mobile device 1100.

The memory 1150 stores the programs (commands) and/or data to be used by the application block 1140, and may include RAM, ROM, flash memory, or the like. Thus, the memory 1150 may include not only volatile storage elements, but also nonvolatile storage elements. For example, the memory 1150 may include the memory system 10 described with reference to FIGS. 1 to 10.

The memory 1150 may include a multi-rank memory device that shares one or more signal lines with a memory controller. The memory controller may determine whether the signal line shared with the multi-ranks should be at an unterminated ODT state and may determine the rank of which the signal line should be at a terminated ODT state, based on the rank identified as the target rank among multi-ranks. The memory controller may broadcast ODT state information of the signal line, which is shared with the multi-ranks, to all memory devices of the multi-ranks, according to the result of determination. The multi-rank memory device may receive ODT state information of the shared signal line, which is broadcast from the memory controller at each memory device of the multi-ranks, and store the received ODT state information in a mode register. Each of the memory devices of the multi-ranks may change the ODT setting of the inside of the memory device connected the signal line, change the reference voltage level provided to the input buffer connected to the signal line, or change the type of the input buffer connected to the signal line, based on the ODT state information of the signal line, which is stored in the mode register.

While the inventive concept has been particularly shown and described with reference to embodiments thereof, it will be understood that various changes in form and details may be made therein without departing from the spirit and scope of the following claims.

What is claimed is:

1. A memory system comprising:
a host system comprising a memory controller configured to control a read operation or a write operation for a plurality of memory ranks configured to share a signal line; and
a multi-rank memory device comprising a nonvolatile memory device configured to store on-die termination (ODT) information of the plurality of memory ranks,
wherein the memory controller is further configured to determine a target rank to be read or written, and transmit a read or write command comprising information about the determined target rank via the signal line, to the multi-rank memory device,
wherein the multi-rank memory device is further configured to perform a comparison of the ODT information of the plurality of memory ranks stored in the nonvolatile memory device with the information about the determined target rank received from the memory controller, determine a memory rank corresponding to the determined target rank and a memory rank corresponding to a non-target rank based on a result of the comparison and set an ODT value of the non-target rank, wherein the ODT value of the non-target rank during the write operation is different from the ODT value of the non-target rank during the read operation.

2. The memory system of claim 1, wherein the multi-rank memory device is further configured to store first information about the target rank and second information about ones of the plurality of memory ranks except the target rank.

3. The memory system of claim 2, wherein the multi-rank memory device is further configured to change ODT values of the plurality of memory ranks, based on the first information and the second information, when a read operation for the multi-rank memory device is performed.

4. The memory system of claim 2, wherein the multi-rank memory device is further configured to change ODT values of the plurality of memory ranks, based on the first information and the second information, when a write operation for the multi-rank memory device is performed.

5. The memory system of claim 1, wherein the multi-rank memory device is further configured to perform a refresh operation of the target rank.

6. The memory system of claim 1, wherein the multi-rank memory device is further configured to perform a fusing operation of the rank information to the nonvolatile memory device.

7. A method of operating a memory system including a plurality of memory ranks configured to share a signal line, the method comprising:

controlling, by a host system comprising a memory controller, a read operation or a write operation for a plurality of memory ranks configured to share the signal line; and storing on-die termination (ODT) information of the plurality of memory ranks in a storage of a multi-rank memory device comprising a nonvolatile memory device configured to store the rank information of the plurality of memory ranks, wherein the controlling of the read or write operation for the plurality of memory ranks comprises:
determining a target rank to be read or written, and transmitting a read or write command comprising information about the determined target rank via the signal line, to the multi-rank memory device; and
comparing the ODT information of the plurality of memory ranks stored in the nonvolatile memory device with the information about the determined target rank received from the memory controller;
determining a memory rank corresponding to the determined target rank and a memory rank corresponding to a non-target rank based on a result of the comparing; and
setting an ODT value of the non-target rank, wherein the ODT value of the non-target rank during the write operation is different from the ODT value of the non-target rank during the read operation.

8. The method of claim 7, wherein the controlling of the read or write operation for the plurality of memory ranks comprises:
storing first information about the target rank and second information about the plurality of memory ranks except the target rank.

9. The method of claim 8, wherein the controlling of the read or write operation for the plurality of memory ranks comprises:
changing ODT values of the plurality of memory ranks, based on the first information and the second information, when a read operation for the multi-rank memory device is performed.

10. The method of claim 8, further comprising:
performing an enable or disable operation of a command/address signal line receiver connected to a command/address signal line, based on the target or non-target information; and
performing an enable or disable operation of a transmit data bus receiver connected to a data bus, based on the target or non-target information.

11. The method of claim 7, further comprising:
transmitting a refresh command to a first rank of the multi-rank memory by a host system,
wherein the controlling of the read or write operation for the plurality of memory ranks further comprises receiving the refresh command and performing a refresh operation of the first rank.

12. The method of claim 7, wherein the controlling of the read or write operation for the plurality of memory ranks further comprises performing a fusing operation of an information of a first rank or a second rank to a memory block.

13. The method of claim 12, wherein the controlling of the read or write operation for the plurality of memory ranks further comprises performing the fusing operation of the information of the first rank or the second rank to a nonvolatile memory device.

14. A host system comprising:
a memory device; and
a memory controller configured to control a read operation or a write operation for a memory device comprising a plurality of memory ranks which share a signal line,
wherein the memory controller is configured to perform operations comprising:
controlling the read or write operation for the plurality of memory ranks; and
storing rank information of the plurality of memory ranks in a storage of a multi-rank memory device comprising a nonvolatile memory device configured to store on-die termination (ODT) information of the plurality of memory ranks,
wherein the controlling of the read or write operation for the plurality of memory ranks comprises:
determining a target rank to be read or written, and transmitting a read or write command comprising information about the determined target rank via the signal line, to the multi-rank memory device; and
comparing the ODT information of the plurality of memory ranks stored in the nonvolatile memory device with the information about the determined target rank received from the memory controller;
determining a memory rank corresponding to the determined target rank and a memory rank corresponding to a non-target rank based on a result of the comparing; and
setting an ODT value of the non-target rank, wherein the ODT value of the non-target rank during the write operation is different from the ODT value of the non-target rank during the read operation.

15. The host system of claim 14, wherein the memory controller is further configured to store first information about the target rank and second information about the plurality of memory ranks except the target rank.

16. The host system of claim 15, wherein the memory controller is further configured to change ODT values of the plurality of memory ranks, based on the first information and the second information, when a read operation for the multi-rank memory device is performed.

17. The host system of claim 15, wherein the memory controller is further configured to change ODT values of the plurality of memory ranks, based on the first information and the second information, when a write operation for the multi-rank memory device is performed.

18. The host system of claim 14, wherein the memory controller is further configured to perform a refresh operation of the target rank.

19. The host system of claim 14, wherein the memory controller is further configured to perform a fusing operation of the target rank to the storage.

* * * * *